(12) United States Patent
Ding et al.

(10) Patent No.: US 7,923,072 B2
(45) Date of Patent: Apr. 12, 2011

(54) SILVER CRYSTALS THROUGH TOLLEN'S REACTION

(75) Inventors: Xiaoling Ding, St. Petersburg, FL (US); David Fries, St. Petersburg, FL (US)

(73) Assignee: University of South Florida, Tampa, FL (US)

( * ) Notice: Subject to any disclaimer, the term of this patent is extended or adjusted under 35 U.S.C. 154(b) by 1032 days.

(21) Appl. No.: 10/905,658

(22) Filed: Jan. 14, 2005

(65) Prior Publication Data

US 2005/0229747 A1  Oct. 20, 2005

Related U.S. Application Data

(60) Provisional application No. 60/536,370, filed on Jan. 14, 2004.

(51) Int. Cl.
B05D 3/02 (2006.01)

(52) U.S. Cl. .................................................. 427/383.1

(58) Field of Classification Search ................ 427/383.1
See application file for complete search history.

(56) References Cited

U.S. PATENT DOCUMENTS

| | | | | |
|---|---|---|---|---|
| 3,519,445 | A | * 7/1970 | MacDowell et al. | 501/10 |
| 4,353,741 | A | * 10/1982 | Capuano et al. | 549/534 |
| 5,376,556 | A | * 12/1994 | Tarcha et al. | 436/525 |
| 6,252,095 | B1 | * 6/2001 | Hayashi et al. | 549/523 |
| 6,572,673 | B2 | 6/2003 | Lee et al. | |

OTHER PUBLICATIONS

Perry's Chemical Engineers' Handbook—7th edition edited by Robert Perry et al. (c) 1997, The McGraw-Hill Companies, Inc. pp. 18-37-18-38.*

Materials Science and Engineering: An Introduction—5th edition edited by William D. Callister, Jr. (c) 2000, Joh Wiley & sons, Inc. pp. 296-297.*

"Heterogeneous Nucleation" from http://web.archive.org/web/20021209120327/wuphys.wustl.edu/%7Ekfk/Nucleation.html as dated available by the Internet Archive Wayback Machine on Dec. 9, 2002.*

Wang et al. "Surface-enhanced Raman Scattering Effect for Ag/TiO2 Composite Particles" Applied Surface Science 147 (1999) p. 52-57.*

(Continued)

*Primary Examiner* — Timothy H Meeks
*Assistant Examiner* — Nathan H Empie
(74) *Attorney, Agent, or Firm* — Michele L. Lawson; Smith & Hopen, P.A.

(57) ABSTRACT

A method for the formation of regular-shaped silver crystals through a wet chemical reaction (Tollen's reaction) is presented. The growth of the Ag crystals (size, morphology and aggregation) can be controlled via adjusting reaction conditions such as temperature and reducing agent concentrations before and during the reactions. The smaller Ag crystals (50-200 nm) were generated under the condition of limited reductive reagent (glucose), and the larger sliver crystals (~5 μm) were the aggregated silver nano-particles (100-200 nm) produced at higher reducing agent concentrations. Most of the larger crystals were in the shape of cube or rectangular cube, and rarely, they were in clusters. The smaller crystals (aggregation of Ag atoms) were shaped in cube or/and cone, and both single crystals and clusters were formed. The presence of impurity (TiO2 nano-particles, 25-50 nm) as crystal seeds enables the 3-D growth of large, irregular-shaped Ag clusters (~5 μm).

14 Claims, 4 Drawing Sheets

OTHER PUBLICATIONS

Yin et al "Synthesis and Characterization of Stable Aqueous Dispersions of Silver Nanoparticles Through the Tollens Process" Journal of Materials Chemistry v12, 2002, p. 522-527.*

Materials Science and Engineering An Introduction 5th edition, edited by William D. Callister, Jr. © 2000, John Wiley & Sons, Inc, p. 33.*

Fukuyo et al., Morphological Evolution of Silver Crystals Produced by Reduction with Ascorbic Acid, Journal of Crystal Growth, 2002, p. 193-199, vol. 241 No. 2002.

Rogach et al., Monitoring the Size of Highly Dispersed Particles of Silver Produced in Chemical Reduction of Silver Ions, Vestn. Beloruss. Gos. Univ, 1995, p. 10-13, 2(2).

Bao et al. 2003. "Study of Silver Films Over Silica Beads as a Surface-Enhanced Raman Scattering (SERS) Substrate for Detection of Benzoic Acid." J. Raman Spectrosc. vol. 34. pp. 394-398.

Moskovits. 2006. "Surface-Enhanced Raman Spectroscopy: a Brief Perspective." Topics Appl. Physics. vol. 103. pp. 1-18.

* cited by examiner

SILVER CRYSTALS THROUGH TOLLEN'S REACTION

CROSS REFERENCE TO RELATED APPLICATIONS

This application claims priority to U.S. Provisional Patent Application No. 60/536,370, with the same title and inventorship.

GOVERNMENT SUPPORT

This invention was developed under support from the United States Army, Space Missile Defense Command under grant DASG60-00-C-0089; accordingly the U.S. government has certain rights in the invention.

BACKGROUND OF THE INVENTION

Nano-scaled silver has received much attention due to its unique electrical conductivity, optical properties, and catalytic capabilities, which allows its potentially wide applications in microelectromechanical system (MEMS) designs. There are many methods to synthesize Ag nanoparticles, for instance, electroless metalization, sol-gel method, vapor deposition, thermal decomposition and reduction of metal salts. Most of the studies are focused on the synthesis of thin layers of Ag films, however, the construction of 3-D silver structures through wet chemical reactions is of extreme lack.

Generally, micro-structures and macro-morphologies play an important role in determining the properties of materials. Morphological modification of crystals through controlled formation is therefore necessary toward the micro- and macro-designs. However, current technologies are limited in their control of the shapes of crystals in solutions. Fukuyo and Imai (Morphological evolution of silver crystals produced by reduction with ascorbic acid. J. Crystal Growth, 241, 193-199, 2002, incorporated herein by reference) obtained silver crystals by reduction of $AgNO_3$ with L-ascorbic acid, however, the unusual morphologies of the crystals (flower-like clusters) greatly limit their applications.

SUMMARY OF INVENTION

The present invention provides a method for synthesizing nano to micro-scaled silver crystals through wet chemical reactions with controlled conditions. The regular shaped crystals (mostly, in cubes) have applications in MEMS designs such as nano-sized optical devices, micro-scaled electrodes, surface plasmon resonance and batteries.

In one embodiment, the present invention includes a method of forming silver crystals comprising the steps of providing a substrate, providing a predetermined amount of Tollen's reagent, mixing the Tollen's reagent with a reduction agent forming a complex placing the complex on the substrate and then heating the substrate.

In one embodiment the Tollen's reagent comprises about 5 mL of 5% $AgNO_3$ solution; 10% NaOH solution, and 2% ammonia solution and the reduction agent is glucose. In alternate embodiments the substrate is heated between room temperature and about 40° C.

In one embodiment the inventive method further comprises the step of adding reduction agent to the complex and/or increasing the temperature of the reaction occurs during the primary nucleation phase. Generally, the final mole ratio of reduction agent and Ag+ is about 1:4.

In an alternative embodiment, Ag crystals are generated in the presence of nano-sized $TiO_2$ particles (25-50 nm) as extra impure "seeds". One mg/mL of homogenously distributed $TiO_2$ in DI water is made under ultrasound for 1 min. $TiO_2$ particles are then added at a ratio of about 10 μL to 1 mL of the Tollen's reaction solution (above) with thorough mixing.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

Figure 1:
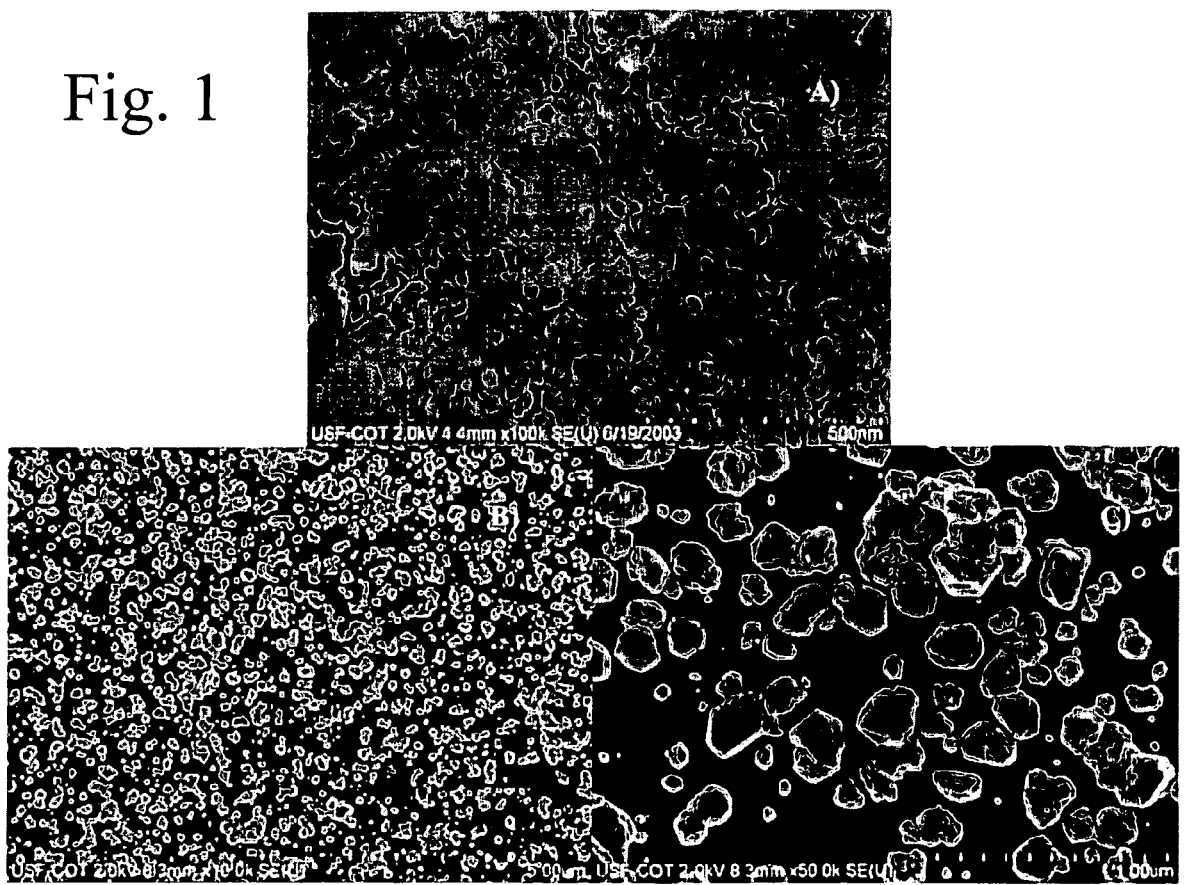
FIG. 1(A-C) are SEM images of A) Ag nano-particles and smaller sized crystals (B and C). The Ag nano-particles were synthesized without addition of glucose and increasing temperature during primary nucleation phase. The Ag crystals in B) and C) were synthesized through increasing temperature to 40° C. during the primary nucleation phase. Both particles and crystals were synthesized with an original Ag+ concentration of 5% and a final 1:4 mole ratio of glucose to Ag+. The sizes of the crystals shown in B) and C) were 50-200 nm.

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Currently, the processes used for producing metal nanoparticles are generally grouped as chemical and physical synthetic methods. The wet chemical reactions (reductions) are used because of their high production capacity, simple preparation process and reaction conditions (e.g., room temperature and ambient atmosphere), and low cost. The method developed herein is associated with the crystallization of Ag from a homogeneous solution through the reduction of argentous ion (Ag+) by glucose.

In general, crystals are grown in many shapes including cubic, tetragonal, orthorhombic, hexagonal, monoclinic, triclinic, and trigonal, which are dependent upon downstream processing or final product requirements. In order for crystallization to take place, the solution must be "supersaturated" with the particles. Primary nucleation (i.e. the growth of a new crystal) is the first step in crystallization, which is initiated by the driving force, supersaturation. Usually, the instantaneous formation of many nuclei can be observed "crashing out" of the solution. In continuous crystallization, once primary nucleation has begun, the crystal size distribution begins to take shape.

The second mechanism in crystallization is secondary nucleation. In this phase, crystal growth is initiated with contact at lower supersaturation (than primary nucleation) where crystal growth is optimal. Secondary nucleation requires "seeds" or existing crystals to perpetuate crystal growth. Again, there is no full theory for predicting secondary nucleation and it's behavior can only be anticipated by experimentation. Mathematically correlating experimental data to model crystallization does exist, however, it is time consuming and often considered extreme for batch operations.

Nucleation can be described by the following empirical equation:

$$B = K_b \Delta C^b M_t^n N^m e^{(-E_b/RT)} \quad \text{Eq. 1}$$

where B is the nucleation rate, Kb is the nucleation rate constant, ΔC is the supersaturation driving force, Mt is the concentration of crystals in the crystal slurry, i.e., magma density, N is agitation rate, Eb is the activation energy for nucleation, R is the gas constant, and T is the absolute temperature.

Crystal growth can also be described by a simple empirical equation [7]:

$$G = K_g \Delta C^g e^{(-E_g/RT)} \quad \text{Eq. 2}$$

where G is the crystal growth rate, Kg is the growth rate constant, Eg is the activation energy for crystal growth.

Both nucleation and crystal growth rates are driven by supersaturation, and concentration and temperature play an important role in Ag crystallization through direct impact on the rates (Eqs. 1 and 2) and supersaturation, and thus the rates, via influencing the formation rate of Ag. Here, Ag crystallization under varied conditions (i.e., reductive reagent concentration and temperature) was investigated by adjusting the degree of Ag supersaturation during the primary nucleation phase. Also, trace amount of TiO2 nano-particles (25-50 nm) were used as extra impure "seeds" for the growth of Ag crystals.

EXAMPLE I

Ag Nano-Particles were synthesized the reduction of Tollen's reagent by glucose. Briefly, argentous ion (Ag+) is a weak oxidizing agent. In the case of Tollen's reagent, the silver ion is complexed with ammonia to form Ag(NH3)2+. To create the Tollen's reagent, according to one embodiment of the present invention: place 5 mL of a 5% AgNO3 solution, and add two drops of 10% NaOH. Add 2% ammonia solution, drop by drop, with constant shaking, until the precipitate of silver oxide dissolves.

The complex is reduced by glucose to metallic silver:

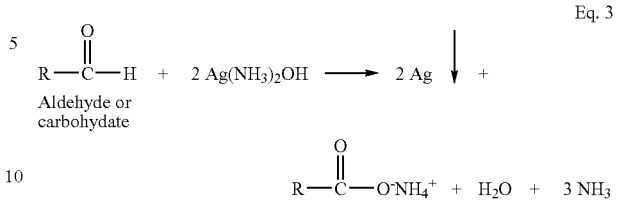

Silver mirror can be formed on clean surfaces. Black Ag2O can be generated under incomplete oxidation or run at high pH. Higher temperature will accelerate the reaction, and the extent of Ag deposition depends on the reagent concentrations and reaction times. Usually, the reaction can be finished within a few minutes under room temperature. Typically, the sizes of the Ag particles are ~100-200 nm.

EXAMPLE II

Figure 4:
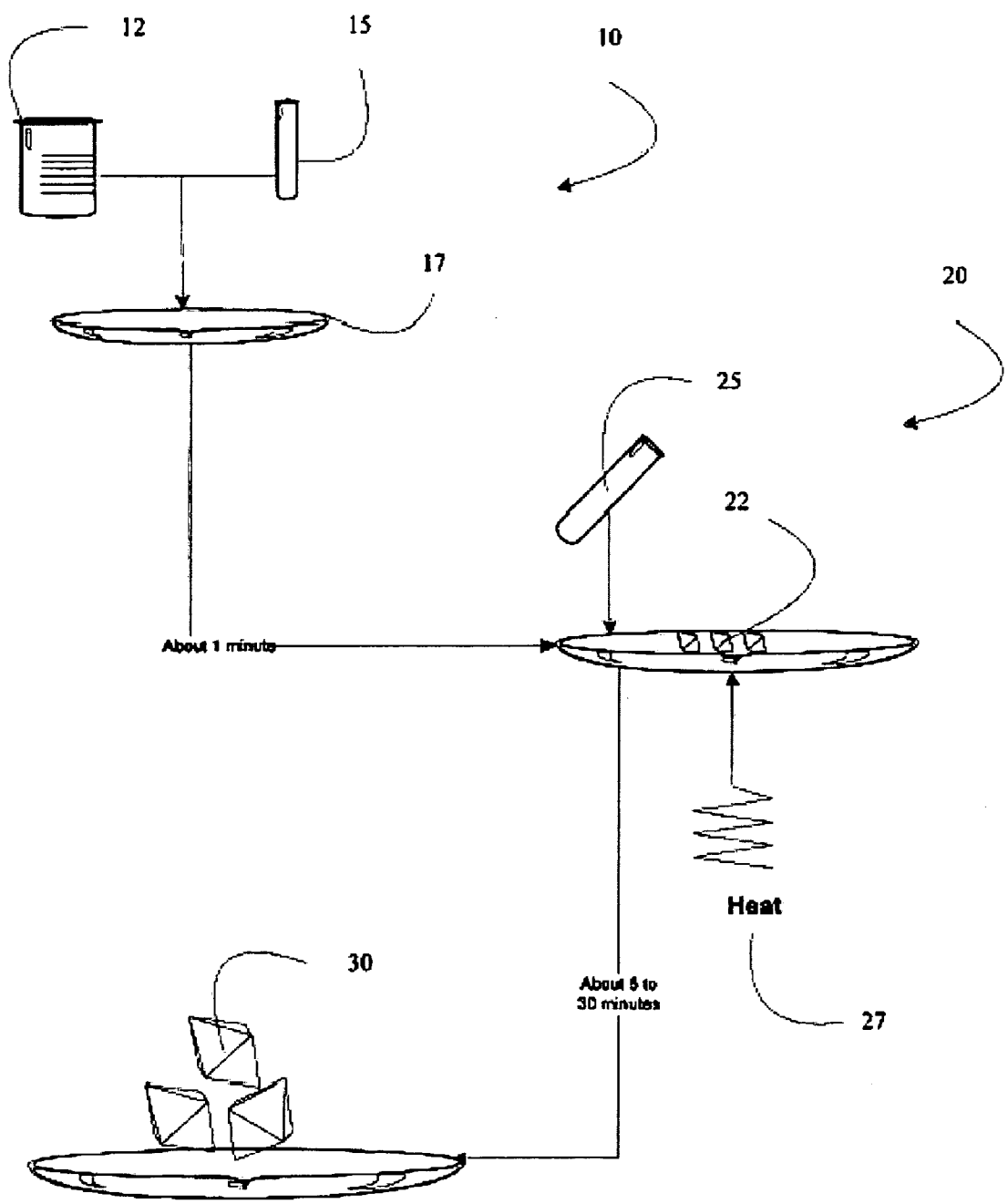
FIG. 4 is a flowchart demonstrating the inventive method.

Silver Crystals were synthesized similarly to Ag nano-particles but with some modification, as shown in FIG. 4. As shown in the first step, designated by numeral identifier 10, a mixture of fresh made Tollen's reagent 12 and glucose solution 15 is loaded on the top of a substrate 17. In step two, 20, once Ag "seeds," 22, begin to occur (usually, ~1 min at room temperature), more glucose 25 is added and/or the substrates were baked at 40° C., 27, without disturbance. Ag crystals, 30, are allowed to grow until the reaction is complete (the reaction time can be about 5 to 30 min depending on the reaction temperature and reagent concentrations). The substrates are then rinsed with DI water.

EXAMPLE III

In another embodiment, Ag crystals are generated under the presence of inert, nano-sized particles (25-50 nm), such as TiO2 as extra impure "seeds". Any inert particle can be used, SiO2 as another example, as an impure seed. One mg/mL of homogenously distributed TiO2 in DI water is made under ultrasound for 1 min. TiO2 particles are then added at a ratio of about 10 pL to 1 mL of the Tollen's reaction solution (above) with thorough mixing.

Figure 2:
FIG. 2(A-F) are SEM images of A) nano-sized silver particles; the silver crystals/clusters in shapes of B) cube; C) hexahedron; D) 3-D cross; E) aggregated double cubes; and F) a larger view of the formation of the crystals/clusters on the top of Ag nano-particles. Beneath the Ag thin film there was a layer of $TiO_2$ nano-particles for the purpose of enhancing Ag attachment. The Ag nano-particles and crystals were synthesized through increasing both glucose concentration and temperature during the phase of primary nucleation. The original concentration of Ag+ was 10% and the mole ratio of glucose to Ag+ was 1:1. The sizes of the Ag particles were 100-200 nm and ~5 μm for the aggregated silver nano-particles.

The morphologies of Ag crystals can be determined under a scanning electron microscope (SEM). FIGS. 1 and 2 clearly showed the formation of Ag crystals, demonstrating that crystallization of Ag atoms and molecules/particles formed from the Tollen's reaction can be controlled through adjusting reaction conditions, thus the supersaturation history, during the primary nucleation. For comparison, non-crystallized Ag nano-particles (FIG. 1A) were obtained under non-changed working conditions (i.e. no addition of extra reducing agent and room temperature).

In general, smaller "seeds" tend to be formed under less extent of supersaturation and agitation. However, low reducing agent concentration may lead to too low reduction rate and even make the reduction impossible. On the contrary, an excess addition of reducing agent at the beginning may cause a strong reducing power and hence lead to excessively fast nucleation. This may result in nano-particles which are too large, irregularly shaped and non-uniform in particle size distribution. Here, the concentration of the reducing agent and/or reaction temperature was increased without disturbance during the primary nucleation phase for the purposes of increasing the extent of supersaturation of Ag particles in a relatively short period to enable the Ag "seeds" to enlarge before they settle down and to allow optimal growth of the crystals under less supersaturation circumstance during/after the "seeds" dwell. Lower driving force at the beginning of crystallization enables the formation of smaller and regular-shaped "seeds," and the following increased driving force during the primary nucleation phase accelerates the growth of crystals on the "seeds" (Eq. 2). The dose of the added reducing agent and the time of addition as well as the mode of agitation increase the complexity of the generation process.

The smaller crystals (typically, 50-200 nm, FIGS. 1B and C) were synthesized under lower reagent concentrations (5% AgNO3 and limited glucose regarding to theoretical amount vs. 10% AgNO3 and theoretical amount of glucose at the final) than the larger crystals (~5 μm, FIG. 2). Ag crystals generated from lower saturated solutions tend to be smaller and less uniformly deposited, which was shown as relatively varied sizes, less covered on the substrates, and more clusters formed (FIGS. 1B and C). This lesser substrate coverage of the smaller Ag crystals could be due to less available Ag particles compared to the larger crystals (FIG. 2A) under lower reagent concentrations. However, the smaller crystals are regularly shaped primary crystals with the aggregation of Ag atoms, while the larger crystals are secondary crystals with the aggregation of Ag molecules (particles). Such secondary aggregation of nano-particles (FIG. 2) also shows that strong driving force due to the generation of extra Ag particles might lead to over-load of seeds instead of enhancing growth of seeds, which was indicated by the irregular-shaped particles (FIG. 2A); and Ag crystallization occurs after the uniform deposition of Ag nano-particles on the substrates.

Figure 3:
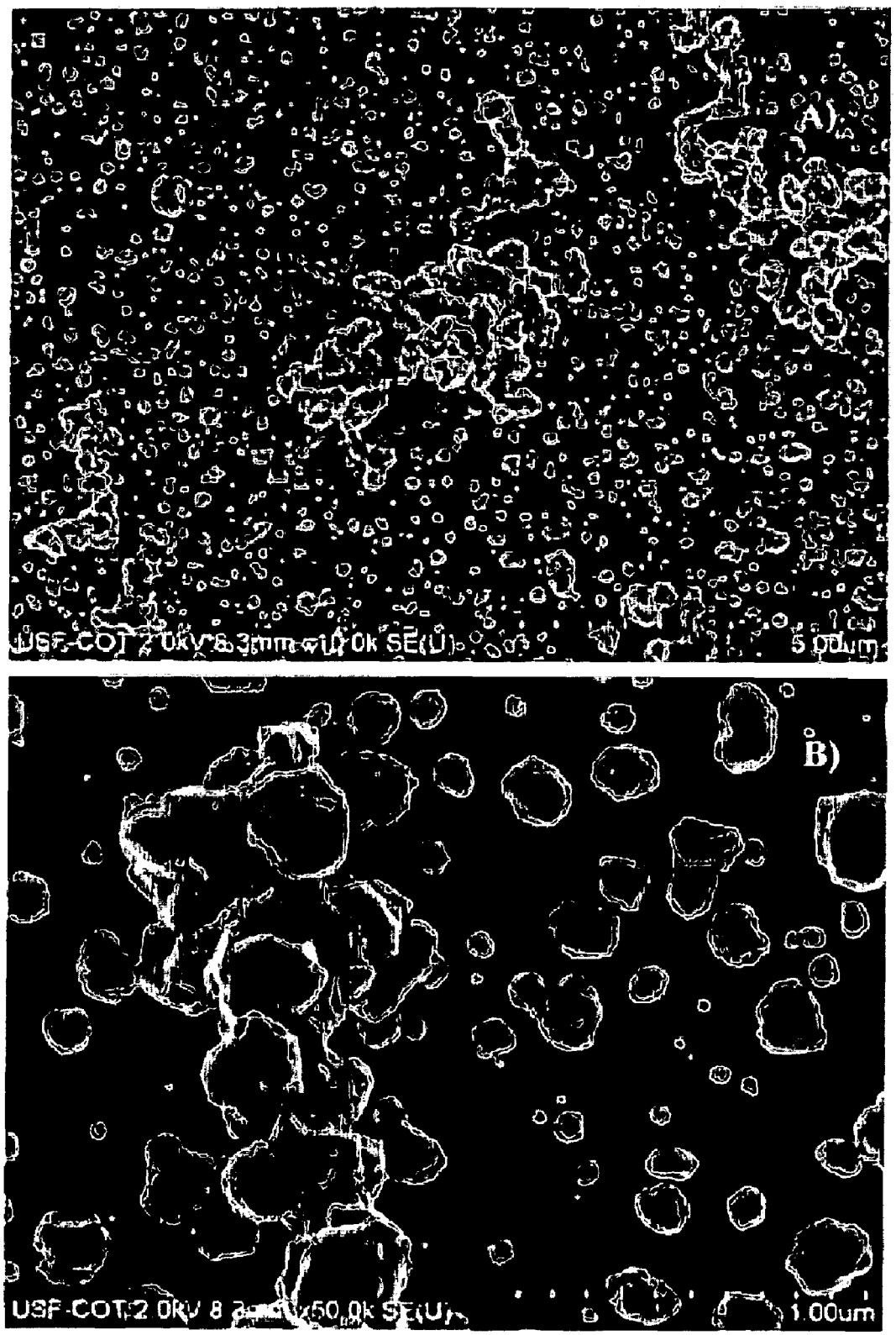
FIG. 3(A-B) are SEM images of Ag crystals with the presence of trace amount of $TiO_2$ nanoparticles (25-50 nm) as impure "seeds" under A) larger (5 μm) and B) smaller (1 μm) scanning scales. The crystals were synthesized with the addition of glucose and increasing temperature during the primary phase under the condition of limited reducing agent (the original Ag+ concentration was 5% and the final mole ratio of glucose to Ag+ was about 1:4).

FIG. 3 shows the formation of Ag crystals under the presence of TiO2 nano-particles. In one embodiment, the mole ratio of TiO2 to Ag was about 1/3,500. TiO2 particles provide lower energy surfaces for the growth of Ag crystals. Larger clusters (typically, <5 μm) were found to distribute on the substrates relatively uniformly (FIG. 3A); and the smaller crystals (FIG. 3) were originated from Ag-seeded nuclei since they are morphologically similar to those formed under similar conditions but without the presence of TiO2 (FIGS. 1B and C). The irregular-shaped Ag clusters grown on the TiO2 seeds may limit their applications in the MEMS designs where regular morphologies are required, however, they will find their applications in some micro-designs (e.g., battery, catalyst, functional membrane etc.) where 3-D/larger contact surfaces are needed. The introduction of impure "seeds" allows the formation of a variety of crystals regarding to sizes and shapes under a simpler and more controllable process.

Silver crystals (aggregated at both atom and molecule levels) were successfully produced via an approach under low temperature (room temperature to 40° C.) and ambient atmosphere. Adjustment of reaction conditions before and during the chemical reactions can control the crystallization (size, morphology and aggregation type). In summary, lower crystallization driving force (i.e., less saturation degree of solution) results in the growth of small crystals (nano-sized) with the aggregation of atoms, while greater driving force leads to the formation of irregular particles and large crystals (micro-sized) with the aggregation of molecules (particles). The presence of impurity (TiO2 nano-particles) enables the growth of large, irregular-shaped Ag clusters.

It will be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might fall therebetween. Now that the invention has been described,

What is claimed is:

1. A method of forming discrete regular-shaped three-dimensional silver crystals comprising the sequential steps of:
    establishing a plurality of nanoparticles, further comprising the steps of
        providing a substrate;
        mixing a predetermined amount of Tollen's reagent having an original $Ag^+$ concentration of 5% with a first reduction agent at a first time point forming a complex at room temperature;
        placing the complex on the substrate at room temperature;
    forming discrete three dimensional crystals, further comprising;
        contacting the complex with the second reduction agent at about 1 minute after the complex is placed on the substrate at room temperature by gradually adding a separate amount of a second reduction agent to the complex at a second timepoint after formation of the complex wherein the final mole ratio of reducing agent to $Ag^+$ is about 1:4; and
        heating the substrate between room temperature and a maximum of about 40° C. for between about 5 and 30 minutes without agitation to form discrete three-dimensional crystals between 50 nm and 5 μm in size.

2. The method of claim 1 wherein the Tollen's reagent comprises about 5 ml of 5% AgNO3 solution; 10% NaOH solution; and 2% ammonia solution.

3. The method of claim 1 wherein the first reduction agent and the second reduction agent is glucose.

4. The method of claim 1 wherein the second reduction agent is added to the complex during the primary nucleation phase.

5. The method of claim 1 further comprising the step of increasing the temperature of the complex during the primary nucleation phase.

6. The method of claim 1, further comprising the step of adding a plurality of inorganic seed particles to the complex.

7. The method of claim 6, wherein the seed particles are between about 25 and 50 nm.

8. The method of claim 6, wherein the seed particles are added at a ratio of 10 μL to 1 ml of Tollen's reagent.

9. A method of forming discrete regular-shaped three-dimensional silver crystals comprising the sequential steps of:
    establishing a plurality of nanoparticles, further comprising the steps of:
        providing a substrate;
        mixing a predetermined amount of Tollen's reagent having an original $Ag^+$ concentration of 10% with a first reduction agent at a first time point forming a complex at room temperature;
        placing the complex on the substrate at room temperature;
    forming discrete regular-shaped three-dimensional crystals further comprising:
        contacting the complex with the second reduction agent at about 1 minute after the complex is placed on the substrate at room temperature by gradually adding a separate amount of a second reduction agent to the complex at a second timepoint after formation of the complex wherein the final mole ratio of reducing agent to $Ag^+$ is about 1:1; and heating the substrate between room temperature and a maximum of about 40° C. for between about 5 and 30 minutes without agitation to form discrete three-dimensional micro-sized crystals.

10. The method of claim 9 wherein the Tollen's reagent comprises about 5 mL of 10% AgNO3 solution; 10% NaOH solution; and 2% ammonia solution.

11. The method of claim 9 wherein the first reduction agent and the second reduction agent is glucose.

12. The method of claim 9, further comprising the step of adding a plurality of inorganic seed particles to the complex.

13. The method of claim 12, wherein the seed particles are between about 25 and 50 nm.

14. The method of claim 12, wherein the seed particles are added at a ratio of 10 μL to 1 ml of Tollen's reagent.

* * * * *